United States Patent [19]
Waller, Jr. et al.

[11] Patent Number: 5,596,646
[45] Date of Patent: Jan. 21, 1997

[54] AUDIO TAPE SATURATION SIMULATOR

[75] Inventors: James K. Waller, Jr., Lake Orion; Mark J. Craven, Metamora, both of Mich.

[73] Assignee: Rocktron Corporation, Rochester Hills, Mich.

[21] Appl. No.: 335,098

[22] Filed: Nov. 7, 1994

[51] Int. Cl.$^6$ .............................. H03G 3/00; H03G 5/00
[52] U.S. Cl. .............................. 381/61; 381/106; 381/98; 333/14
[58] Field of Search .............................. 381/61, 98, 106, 381/83, 93; 333/14, 28 T

[56] References Cited

U.S. PATENT DOCUMENTS

| | | | |
|---|---|---|---|
| 3,772,479 | 11/1973 | Hilbert | 381/18 |
| 4,399,342 | 8/1983 | Ishida et al. | 318/3 |
| 4,783,819 | 11/1988 | De Koning et al. | 381/93 |
| 4,809,336 | 2/1989 | Pritchard | 381/61 |
| 5,032,796 | 7/1991 | Tiers et al. | 381/61 |

*Primary Examiner*—Curtis Kuntz
*Assistant Examiner*—Xu Mei
*Attorney, Agent, or Firm*—Frank J. Catalano; Scott R. Zingerman

[57] ABSTRACT

An analog tape saturation simulator produces the same results as analog tape saturation in a controllable environment which can be user adjusted to the desirable level of saturation effect. A log-based audio detector receives the audio signal in front of a circuit limiting the maximum range over which a dynamic filter will operate to control the high frequency bandwidth via a voltage-controlled low pass filter which follows a soft-clipping distortion circuit also receiving the audio signal. The simulator provides dynamic changes to the signal based on the level of simulated saturation taking place. The simulator produces the nonlinear, soft clipping characteristics of overdriving analog tape and dynamically reduces the high frequency information in response to the input amplitude of the audio signal.

7 Claims, 4 Drawing Sheets

AUDIO TAPE SATURATION SIMULATOR

BACKGROUND OF THE INVENTION

This invention relates generally to audio signal processing and more specifically concerns audio signal processing which simulates analog tape saturation.

Until recent years, all popular forms of music have been recorded by analog means to magnetic tape. However, the advent of digital technology has revolutionized the industry by providing a much more powerful and precise means of recording. Therefore, an increasing amount of material is now recorded digitally.

While this drastic change in technology provides many advantages over the previous method, digital technology has not been well received among many critical listeners. This is primarily due to the difference in nature of these recording processes. The analog recording process has a very limited dynamic range, typically on the order of 60 dB. Therefore, it has been desirable to record signals as "hot" or high in level as possible in order to obtain the best signal-to-noise ratio. The hotter a signal is recorded, the higher the level of tape saturation that occurs. When tape saturation occurs the amount of harmonic distortion increases and the high frequency information is attenuated. This side effect has been used for years to add a certain sound quality to many recordings. In many cases the recording engineer will purposely overdrive many of the individually recorded tracks, such as vocals and individual instruments, to add this audible characteristic. Conversely, state of the art digital recording has a dynamic range of approximately 100 dB. Therefore, it is not desirable to overdrive digital recordings because the sound is not as pleasant to the ear.

Nevertheless, the benefits of digital recording outweigh those of analog and therefore digital is quickly becoming the most common recording format. There is, however, still a strong desire to provide the sonic artifacts associated with overdriven analog tape. Because of the high efficiency of digital recording components, digitally recorded material contains considerably more audible information, particularly high end information, than can be captured onto magnetic tape. But, when compared, the digital signal sounds much more harsh than the analog signal which has a much smoother high end.

As the industry has moved towards digital recording due to its higher level of control and performance, the absence of any product which provides exactly what analog tape saturation provided for the recording industry has caused people to begin using tube compressors, tube mic preamps and other products which are tube-based in an attempt to regain at least a small degree of the warmth that the analog tape machine provided. These tube-based products generate considerably higher distortion than their solid state counterparts, although not nearly as much as could be derived from the use of an analog tape machine. In addition, such products do not provide the bandwidth limitations which change dynamically, especially when transients occur. As analog tape is hit with a transient, such as a snare drum, saturation produces a loss of high frequency predominantly on the transient. During the decay of the instrument, the high frequency roll-off diminishes. Until now, the only method available to derive this effect was through the use of an analog tape machine.

It is, therefore, an object of this invention to provide an audio tape saturation simulator which yields the same auditory results when recording in the digital realm as would be accomplished if recording directly to analog tape. It is a further object of this invention to provide an audio tape saturation simulator which yields analog recording auditory results while allowing the recordist to maintain the efficiency, clarity and convenience of digital mediums. It is also an object of this invention to provide an audio tape saturation simulator which derives critical soft clipping distortion aspects by using either a vacuum tube, a solid state circuit, or a DSP algorithm modeled to provide similar performance results. Another object of this invention is to provide an audio tape saturation simulator which accepts digitally recorded signals, or can be used on individual instruments prior to recording, and transforms them into signals that sound as if they were recorded by traditional analog means. And it is an object of this invention to provide an audio tape saturation simulator which, as is the case when recording to analog tape, provides more saturation/distortion effect and greater reduction of the high frequency bandwidth of the signal as the signal is driven harder into the simulator.

SUMMARY OF THE INVENTION

In accordance with the invention, an analog tape saturation simulator is provided which produces the same results as analog tape saturation in a controllable environment which can be user adjusted to the desirable level of saturation effect. A log-based audio detector is used in front of a limiter circuit, which limits the maximum range over which a dynamic filter will operate to control the high frequency bandwidth via a voltage-controlled low pass filter which follows a soft-clipping distortion circuit. The simulator provides dynamic changes to the signal based on the level of simulated saturation taking place. The simulator produces the nonlinear, soft clipping characteristics of overdriving analog tape and dynamically reduces the high frequency information in response to the input amplitude of the audio signal.

BRIEF DESCRIPTION OF THE DRAWINGS

Other objects and advantages of the invention will become apparent upon reading the following detailed description and upon reference to the drawings in which.

While the invention will be described in connection with several preferred embodiments, it will be understood that it is not intended to limit the invention to those embodiments. On the contrary, it is intended to cover all alternatives, modifications and equivalents as may be included within the spirit and scope of the invention as defined by the appended claims.

DETAILED DESCRIPTION OF THE INVENTION

Figure 1:
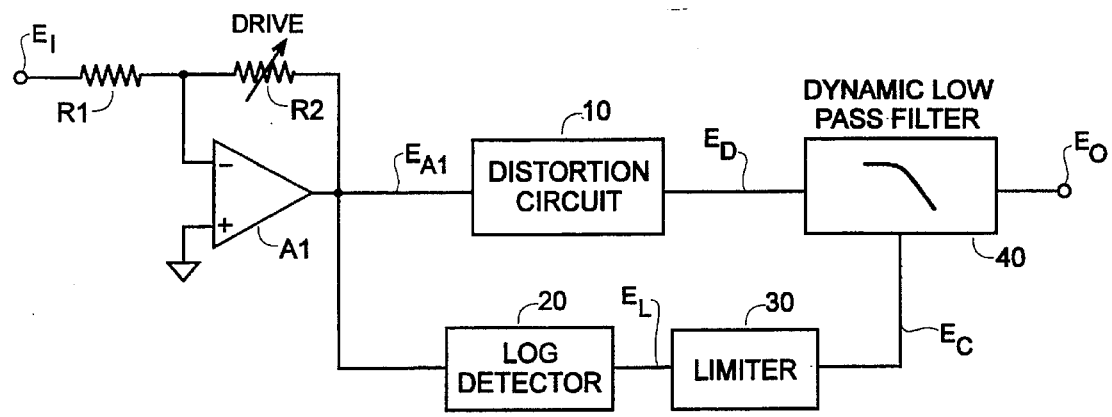
FIG. 1 is a block diagram of a preferred embodiment of the present invention.

Referring to FIG. 1, an input signal $E_I$ is applied to an operational amplifier A1 through a resistor R1. A variable resistor R2 in the feedback loop of the operational amplifier A1 provides user adjustment for the amount of drive into the remainder of the circuitry and defines the amount of the effect that is produced. The output of the amplifier A1 drives both a soft clipping distortion circuit 10 and a log-based audio level detector 20.

Although it is preferable to utilize a log-based audio level detector, other detection methods such as peak, RMS, averaging and the like will provide adequate results. A log-based level detector suitable to this application is described in greater detail in my U.S. Pat. No. 4,745,309. The output of the log-based detector 20 feeds a limiter 30 which limits the range over which a dynamic low pass filter 40 will operate. Processing the DC output of a level detector to provide a limiter function is well known in the art.

Figure 2:
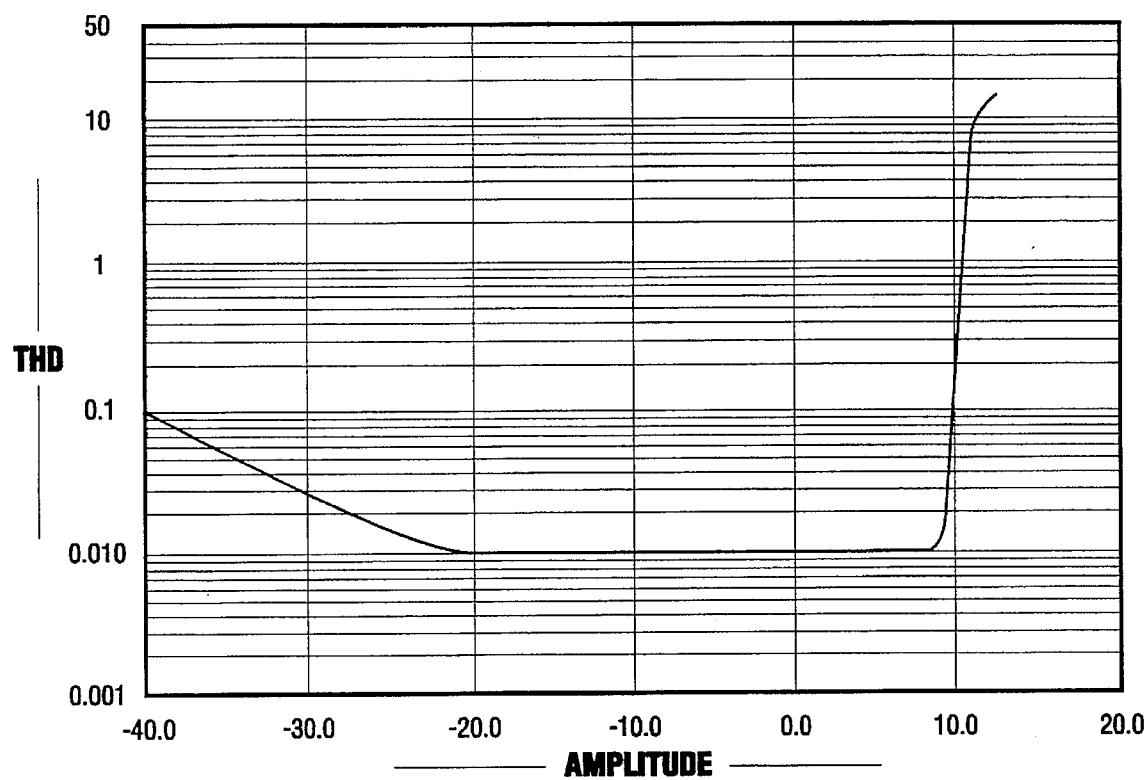
FIG. 2 is a graphic representation of a typical distortion vs. amplitude response of presently known hard clipper circuits.
Figure 3:
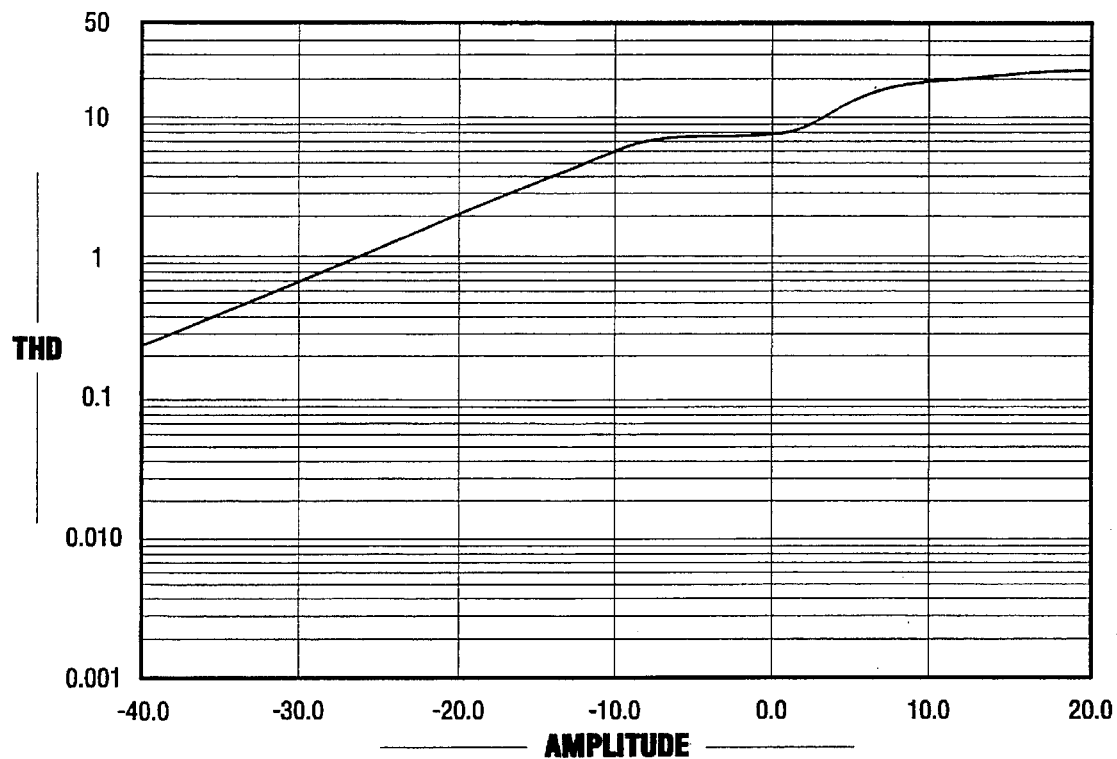
FIG. 3 is a graphic representation of the soft clipper distortion vs. amplitude response desired in the present invention.

The distortion circuit 10 specifically produces the soft distortion characteristics necessary to achieve the desired results. Generation of hard clipping to produce a tremendously distorted guitar sound with large amounts of gain is also well known in the art. In the case of analog tape saturation, a much more gradual curve is required going into higher levels of distortion. Referring to FIG. 2, in a typical hard clipping distortion circuit, the distortion level goes from 0.1% to 10% with only 1–2 dB difference in input level. However, as shown in FIG. 3, a desirable soft clipping distortion response goes from 1% to 10% distortion over a range of nearly 30 dB. A soft clipping circuit thus provides the much more gradual increase in distortion vs. input level that is required to simulate the tape saturation effect.

Figure 4:
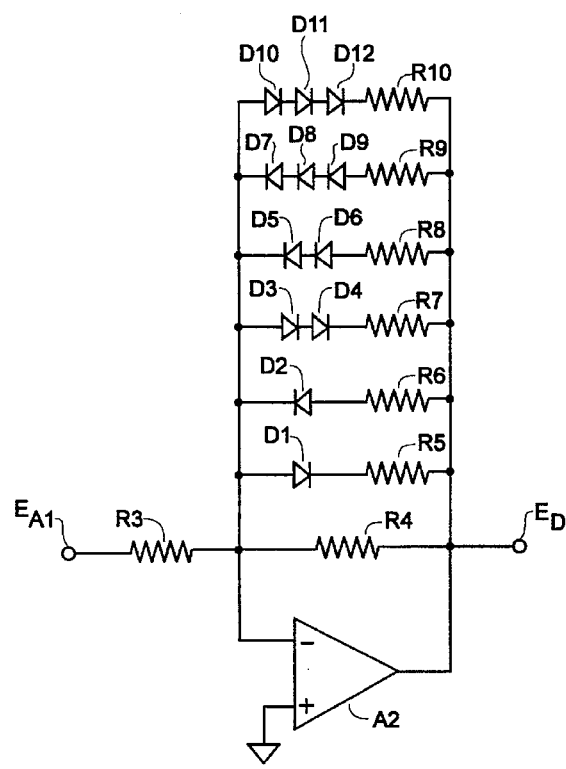
FIG. 4 is a schematic diagram of a preferred embodiment of a soft clipper circuit using solid state components which provides a distortion vs. amplitude response similar to that of FIG. 3.

There are a number of methods that can be used to derive the desired distortion vs. input level response. A preferred solid state distortion circuit is shown in FIG. 4. An input signal $E_{AI}$ is fed through a resistor R3 and applied to the negative input of another amplifier A2. A resistor R4 in the feedback path of the second amplifier A2 is of relatively high value in comparison to the input resistor R3 so that a large amount of gain is available, typically 20–30 dB. Additional paths are provided for both positive and negative feedback. A first path through one diode D1 and a resistor R5 provides a feedback path for negative-going voltages at the output $E_D$ of the second amplifier A2. The soft clipper circuit can be configured so that the value of this resistor R5 is larger than the value of another resistor R6 which, with another diode $D_2$, provides a second feedback path so that soft clipping is achieved sooner with the positive-going voltages at the output $E_D$ of the second amplifier A2. The path through the second diode D2 and the second resistor R6 provides a feedback path for positive-going voltages at the output $E_D$ of the second amplifier A2. Each additional path provides increased clipping at a higher input level, but the distortion becomes more dramatic. A third path through a pair of diodes D3 and D4 and a resistor R7 provides soft clipping for negative-going voltages. A fourth path through another pair of diodes D5 and D6 and another resistor R6 provides feedback and soft clipping for positive-going voltages. A fifth path through a series of three diodes D7, D8 and D9 and a resistor R9 provides soft clipping for negative-going voltages. A sixth path through a series of three diodes D10, D11 and D12 and a resistor R10 provides soft clipping for positive-going voltages. All of the paths can be structured to provide the non-symmetrical clipping typical to tube type distortion. This distortion circuit provides a replication of a much more gradual increase in distortion vs. input level and provides a solid state implementation of a soft clipper. Depending on the value chosen for the first resistor R3, which is based on the particular application and required input level to drive the circuit into clipping, it would be obvious to one skilled in the art how to configure this circuit for proper operation. Therefore, component values have been omitted.

Figure 5:
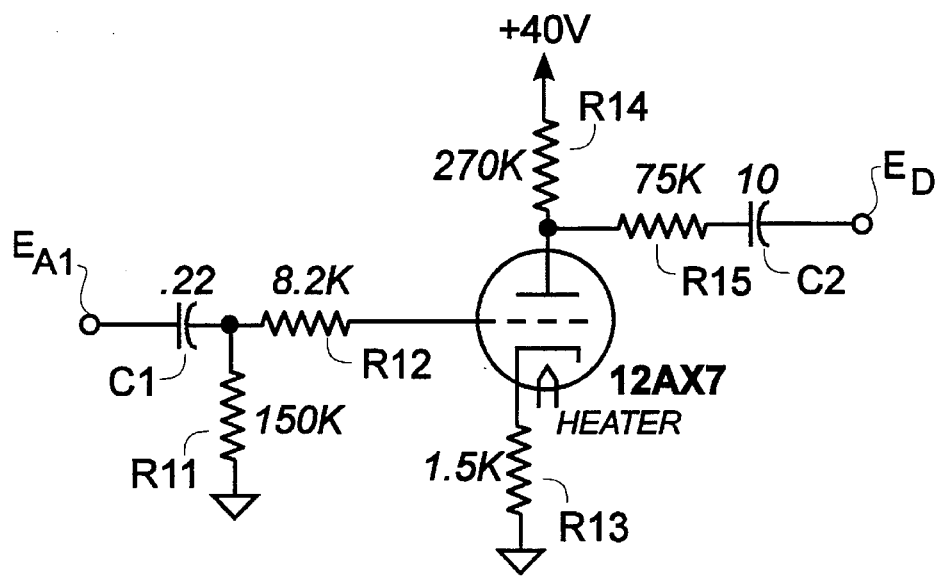
FIG. 5 is a schematic diagram of a preferred embodiment of a soft clipper circuit using a vacuum tube which provides a distortion vs amplitude response similar to that of FIG. 3.

A preferred tube circuit for deriving the softer clipping distortion implements a single stage tube. As shown in FIG. 5, the soft clipper tube circuit uses a single stage of a 12AX7 Twin Triode tube. The vacuum tube has a distortion response curve which is very close to the desired response shown in FIG. 3, and is therefore a very good choice for the soft clipper. The input signal $E_{AI}$ is AC coupled by a capacitor C1 to a grid input resistor R12. Another resistor R11 provides ground referenced grid bias for the input of the tube's grid circuit. A third resistor R13 provides the cathode bias required for proper circuit operation. A fourth resistor R14 is connected between +40 volts and the plate of the triode circuit to provide the high voltage bias for the plate. A fifth resistor R15 is a build-out resistor for the plate output signal, and a second capacitor C2 is a DC blocking capacitor for the output $E_D$. The circuit shown has a fixed gain of approximately 20 dB, and interfaces with the input variable gain stage amplifier A1 shown in FIG. 1.

A third method for deriving the soft clipper circuit would be to model a DSP or Digital Signal Processor algorithm to replicate the desired soft clipping response. A complete model of all elements of the invention could be implemented in DSP.

Any of the previously described distortion circuits could be used, or there are many other methods known in the art to generate a more gradual and soft threshold of clipping which could be implemented for the distortion circuit to provide the saturation characteristics. Referring again to FIG. 1, the audio output $E_D$ of the distortion circuit 10 is followed by a voltage controlled dynamic low pass filter or VCF 40 which operates in response to the DC voltage applied to its control port by the limiter 30. There are a number of different voltage controlled filter circuits which will operate in the disclosed system with favorable results, but the voltage controlled filter circuit 40 produces excellent results for a number of reasons. The heart of the VCF 40 shown is a high quality voltage controlled amplifier or VCA with logarithmic control producing a linear volt-per-decibel or "deci-linear" response. VCAs with this characteristic are commonly known.

Figure 6:
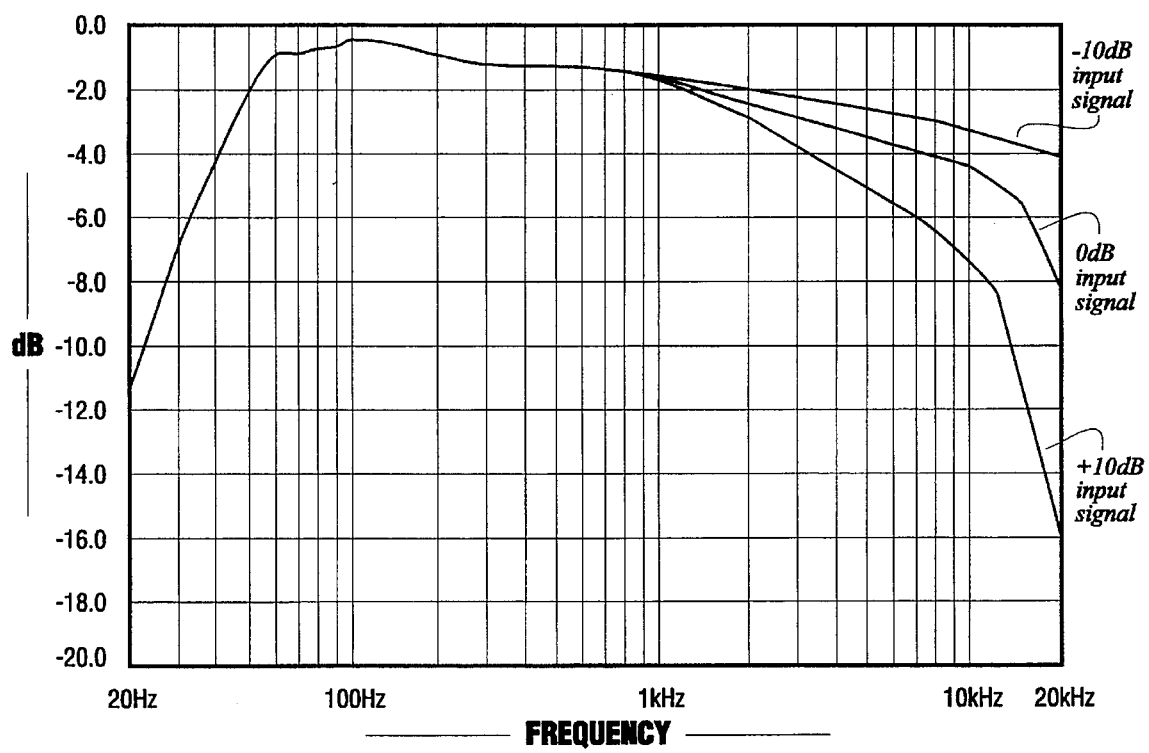
FIG. 6 is a graphic representation of the measured amplitude vs frequency response of a typical analog tape machine.
Figure 7:
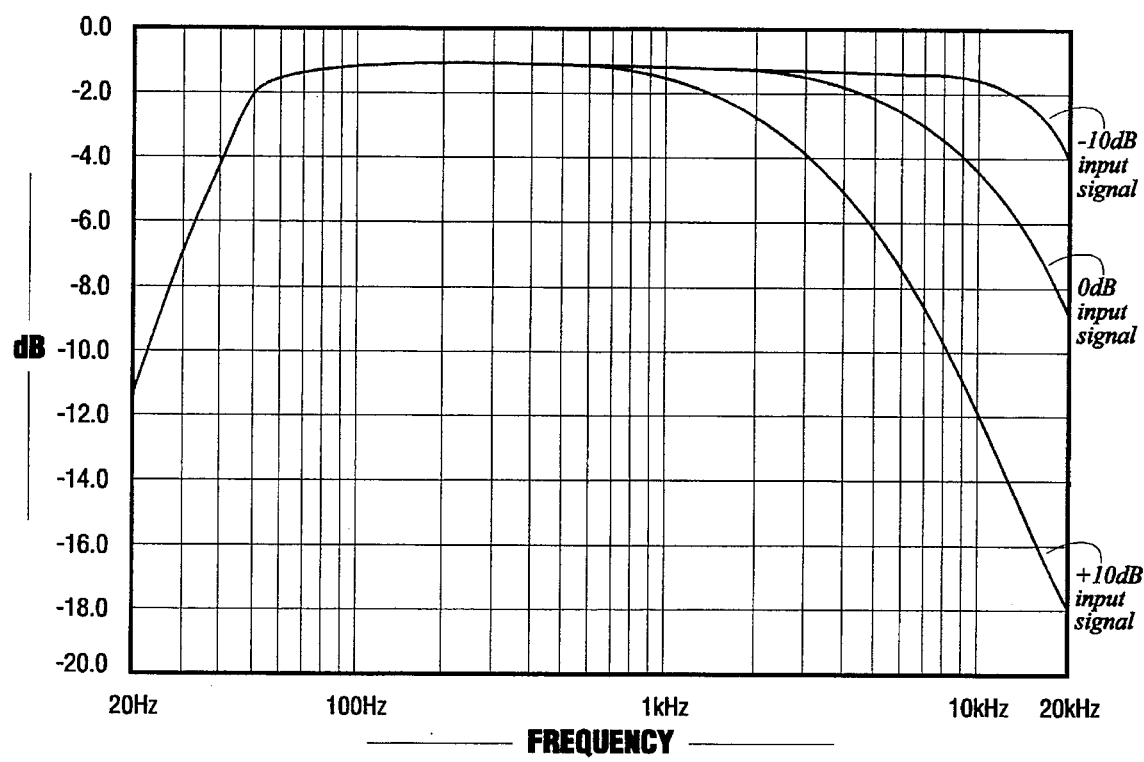
FIG. 7 is a graphic representation of the measured amplitude vs frequency response of the dynamic low pass filter of the embodiment of FIG. 1.

FIG. 6 represents a graphical representation of the frequency vs. decibel response of a typical analog tape machine at various input levels. FIG. 7 shows a graphical representation of the frequency vs. decibel response of the dynamically controlled low pass filter 40 at various input levels. The dynamically controlled low pass filter 10 can be configured to provide the desired response.

Referring again to FIG. 1, when the components of the simulator operate in concert, the more the input signal $E_I$ is increased, the more the distortion increases in the distortion circuit 10 and the higher the signal level going into the log detector 20. The higher signal level to the log detector 20 results in a higher output voltage $E_L$ from the log detector 20 and therefore a higher voltage $E_C$ applied to the control port of the dynamic low pass filter 40, thus producing a simultaneous increase in distortion and decrease in the high frequency bandwidth at the output $E_O$ of the simulator. The combination of these two effects occurring simultaneously provides a result which replicates that derived from overdriving analog tape.

Thus, it is apparent that there has been provided, in accordance with the invention, an audio tape saturation simulator that fully satisfies the objects, aims and advantages set forth above. While the invention has been described in conjunction with specific embodiments thereof, it is evident that many alternatives, modifications and variations will be apparent to those skilled in the art and in light of the foregoing description. Accordingly, it is intended to embrace all such alternatives, modifications and variations as fall within the spirit of the appended claims.

What is claimed is:

1. An audio tape saturation simulator comprising:

means for soft clipping an input audio signal to produce a distorted signal having an increase in distortion as said audio signal increases;

means for dynamically low pass filtering said soft clipped signal to produce an output audio signal;

means for level detecting said input audio signal to produce a DC signal of level increasing as said audio signal increases; and means for limiting the range of said DC signal to produce a signal for controlling said filtering means whereby a decrease in high frequency bandwidth of said output signal simultaneously accompanies said increase in distortion.

2. A simulator according to claim 1 further comprising means for varying the level of said input signal.

3. A simulator according to claim 1, said soft clipping means comprising a solid state circuit.

4. A simulator according to claim 1, said soft clipping means comprising a vacuum tube circuit.

5. A simulator according to claim 1, said soft clipping means comprising a digital signal processor having an algorithm for producing a soft clipping distortion vs amplitude response.

6. A simulator according to claim 1, said level detecting means comprising a log based audio level detector.

7. A process for simulating audio tape saturation comprising the steps of:

soft clipping an input audio signal to produce a distorted signal having an increase in distortion as said audio signal increases;

dynamically low pass filtering said soft clipped signal to produce an output audio signal;

level detecting said input audio signal to produce a DC signal of level increasing as said audio signal increases; and limiting the range of said DC signal to produce a signal for controlling said filtering of said soft clipped signal whereby a decrease in high frequency bandwidth of said output signal simultaneously accompanies said increase in distortion.

\* \* \* \* \*